(12) United States Patent
Matsumoto

(10) Patent No.: US 12,334,894 B2
(45) Date of Patent: Jun. 17, 2025

(54) BAND-PASS FILTER

(71) Applicant: TDK CORPORATION, Tokyo (JP)

(72) Inventor: Yuki Matsumoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 246 days.

(21) Appl. No.: 18/179,737

(22) Filed: Mar. 7, 2023

(65) Prior Publication Data

US 2023/0318560 A1 Oct. 5, 2023

(30) Foreign Application Priority Data

Mar. 30, 2022 (JP) .................. 2022-055599

(51) Int. Cl.
*H03H 7/01* (2006.01)
*H01F 27/28* (2006.01)
*H01G 4/30* (2006.01)
*H03H 1/00* (2006.01)

(52) U.S. Cl.
CPC ....... *H03H 7/0115* (2013.01); *H01F 27/2804* (2013.01); *H01G 4/30* (2013.01); *H03H 7/17* (2013.01); *H01F 2027/2809* (2013.01); *H03H 2001/0085* (2013.01)

(58) Field of Classification Search
CPC . H03H 7/09; H03H 2001/0085; H03H 7/0115
USPC ......................................... 333/175, 176, 185
See application file for complete search history.

(56) References Cited

U.S. PATENT DOCUMENTS

| | | | |
|---|---|---|---|
| 8,289,103 B2 * | 10/2012 | Yamakawa | H03H 7/1758 333/175 |
| 2008/0042774 A1 * | 2/2008 | Talbot | H03H 7/38 333/33 |
| 2020/0228155 A1 | 7/2020 | Kido | |
| 2022/0294410 A1 * | 9/2022 | Sato | H03H 7/0123 |

* cited by examiner

*Primary Examiner* — Rakesh B Patel
(74) *Attorney, Agent, or Firm* — Oliff PLC

(57) ABSTRACT

A band-pass filter includes a first port, a second port, first to third high-pass filters provided between the first port and the second port in this order from a first-port side in a circuit configuration, and a low-pass filter provided between the second high-pass filter and the third high-pass filter in the circuit configuration. Each of the first to third high-pass filters forms an attenuation pole on a low-pass side of the passband. A frequency of the attenuation pole formed by the second high-pass filter is higher than a frequency of the attenuation pole formed by each of the first and third high-pass filters.

16 Claims, 12 Drawing Sheets

BAND-PASS FILTER

CROSS REFERENCE TO RELATED APPLICATIONS

This application claims the benefit of Japanese Priority Patent Application No. 2022-055599 filed on Mar. 30, 2022, the entire contents of which are incorporated herein by reference.

BACKGROUND OF THE INVENTION

1. Field of the Invention

The present invention relates to a band-pass filter including a plurality of high-pass filters.

2. Description of the Related Art

One of electronic components used in communication apparatuses is a band-pass filter. Such a band-pass filter can be configured, for example, by serially connecting a high-pass filter forming an attenuation pole on a low-pass side of the passband of the band-pass filter and a low-pass filter forming an attenuation pole on a high-pass side of the passband of the band-pass filter.

US 2020/0228155 A1 discloses a band-pass filter in which a high-pass filter and a low-pass filter are serially connected. Each of the high-pass filter and the low-pass filter includes an inductor.

The recent market demands for reduction in size and footprint of the compact mobile communication apparatuses and have also required miniaturization of band-pass filters for use in those communication apparatuses. As band-pass filters suitable for miniaturization, band-pass filters using a stack including a plurality of dielectric layers and a plurality of conductor layers stacked together is known.

When a high-pass filter and a low-pass filter are integrated into the stack, miniaturization of the stack causes unintended magnetic coupling occurring between an inductor of the high-pass filter and an inductor of the low-pass filter, to be too strong in some cases. This has sometimes interfered with the implementation of desired characteristics. To address this, US 2020/0228155 A1 discloses a technique for making directions of magnetic fluxes of two respective inductors be orthogonal to each other to prevent the two inductors from magnetically coupled with each other.

Band-pass filters are required to have a sufficiently large pass attenuation in a stop band. As a means for increasing pass attenuation in a stop band on a low-pass side of a passband, provision of a plurality of high-pass filters is conceivable. It is also conceivable that, in a small band-pass filter, the directions of the magnetic fluxes of a plurality of respective inductors of a plurality of high-pass filters are made different from each other to prevent the plurality of inductors from magnetically coupling with each other. However, in actual production of products, pass attenuation in a stop band failed to be sufficiently large in some cases.

SUMMARY OF THE INVENTION

An object of the present invention is to provide a band-pass filter in which pass attenuation can be large on a low-pass side of a passband.

The band-pass filter according to the present invention is a band-pass filter that selectively passes a signal of a frequency in a predetermined passband. The band-pass filter according to the present invention includes, a first port, a second port, and a first high-pass filter, a second high-pass filter, and a third high-pass filter provided between the first port and the second port in this order from a first-port side in a circuit configuration, and a first low-pass filter provided between the second high-pass filter and the third high-pass filter in the circuit configuration. Each of the first to third high-pass filters forms an attenuation pole on a low-pass side of the passband. A frequency of the attenuation pole formed by the second high-pass filter is higher than a frequency of the attenuation pole formed by each of the first and third high-pass filters.

In the band-pass filter according to the present invention, no low-pass filter may be provided between the first high-pass filter and the second high-pass filter in the circuit configuration.

In the band-pass filter according to the present invention, the frequency of the attenuation pole formed by the first high-pass filter may be different from the frequency of the attenuation pole formed by the third high-pass filter.

The band-pass filter according to the present invention may further include a stack including a plurality of dielectric layers stacked together. The first port, the second port, the first high-pass filter, the second high-pass filter, the third high-pass filter, and the first low-pass filter may be integrated into the stack. In this case, the third high-pass filter need not necessarily be adjacent to the first high-pass filter in the stack. The second high-pass filter may be arranged between the first high-pass filter and the third high-pass filter in the stack. The first low-pass filter may be arranged between the first high-pass filter and the third high-pass filter in the stack.

When the band-pass filter according to the present invention includes the stack, the first to third high-pass filters need not necessarily physically share the ground in the stack. In this case, the band-pass filter according to the present invention may further include a first ground terminal, a second ground terminal, and a third ground terminal arranged on an outer surface of the stack. The first high-pass filter may be electrically connected to the first ground terminal. The second high-pass filter may be electrically connected to the second ground terminal. The third high-pass filter may be electrically connected to the third ground terminal. In this case, the first high-pass filter may include a first inductor. The second high-pass filter may include a second inductor. The third high-pass filter may include a third inductor. The first to third inductors need not necessarily be electrically connected to each other in the stack.

In a case where the band-pass filter according to the present invention includes the stack, the first high-pass filter may include the first inductor wound around a first axis. The second high-pass filter may include the second inductor wound around a second axis. The third high-pass filter may include the third inductor wound around a third axis. The first axis and the second axis may extend in directions different from each other. The second axis and the third axis may extend in directions different from each other. Each of the first axis, the second axis, and the third axis may be orthogonal to a stacking direction of the plurality of dielectric layers. The first low-pass filter may include a fourth inductor wound around a fourth axis. The fourth axis may extend in a direction different from one or more directions of one or two of the first axis, the second axis, and the third axis.

The band-pass filter according to the present invention includes the first high-pass filter, the second high-pass filter, and the third high-pass filter provided between the first port and the second port in this order from the first-port side in the circuit configuration. A frequency of the attenuation pole formed by the second high-pass filter is higher than a frequency of the attenuation pole formed by each of the first and third high-pass filters. With these configurations, according to the present invention, it is possible to increase the pass attenuation on the low-pass side of the passband.

Other and further objects, features and advantages of the present invention will appear more fully from the following description.

DETAILED DESCRIPTION OF THE PREFERRED EMBODIMENTS

Figure 1:
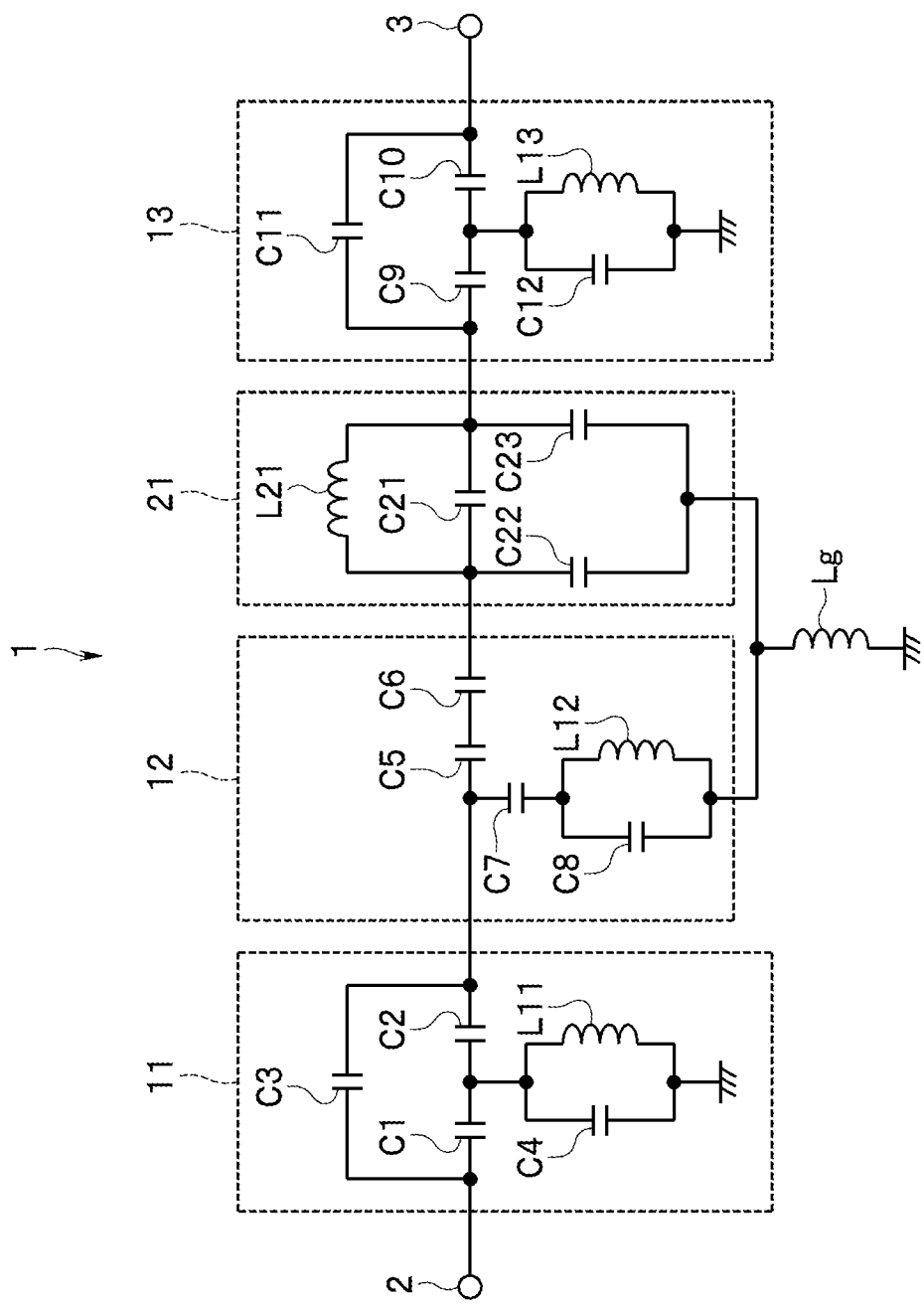
FIG. 1 is a circuit diagram showing a circuit configuration of a band-pass filter according to an embodiment of the present invention.

An embodiment of the present invention will now be described in detail with reference to the drawings. First, reference is made to FIG. 1 to outline a configuration of a band-pass filter 1 according to the embodiment of the present invention. The band-pass filter 1 according to the present embodiment selectively passes a signal of a frequency in a predetermined passband.

The band-pass filter 1 includes a first port 2, a second port 3, a first high-pass filter 11, a second high-pass filter 12, a third high-pass filter 13, and a low-pass filter 21. Each of the first and second ports 2 and 3 is a port for input or output of a signal. Specifically, when a signal is input to the first port 2, a signal is output from the second port 3. When a signal is input to the second port 3, a signal is output from the first port 2.

The first to third high-pass filters 11, 12, and 13 are provided between the first port 2 and the second port 3 in this order from the first-port-2 side in a circuit configuration. The low-pass filter 21 is provided between the second high-pass filter 12 and the third high-pass filter 13. In the band-pass filter 1, no low-pass filter is provided between the first high-pass filter 11 and the second high-pass filter 12 in the circuit configuration. Note that, in the present application, the phrase "in a circuit configuration" is used to describe layout in a circuit diagram, not in a physical configuration.

Each of the first to third high-pass filters 11 to 13 forms an attenuation pole on a low-pass side of the passband of the band-pass filter 1 in pass attenuation characteristics of the band-pass filter 1. The frequency of the attenuation pole formed by the second high-pass filter 12 is higher than the frequency of the attenuation pole formed by each of the first and third high-pass filters 11 and 13. The frequency of the attenuation pole formed by the first high-pass filter 11 and the frequency of the attenuation pole formed by the third high-pass filter 13 are different from each other.

The low-pass filter 21 forms an attenuation pole on a high-pass side of the passband of the band-pass filter 1 in the pass attenuation characteristics of the band-pass filter 1.

The pass attenuation characteristics of the band-pass filter 1 and the attenuation pole formed by each of the first to third high-pass filters 11 to 13 will be described below in detail.

Reference is now made to FIG. 1 to described an example of a configuration of the first high-pass filter 11, the second high-pass filter 12, the third high-pass filter 13, and the low-pass filter 21.

The first high-pass filter 11 includes a first inductor L11 and capacitors C1, C2, C3, and C4. One end of the capacitor C1 is connected to the first port 2. One end of the capacitor C2 is connected to the other end of the capacitor C1. One end of the capacitor C3 is connected to the one end of the capacitor C1. The other end of the capacitor C3 is connected to the other end of the capacitor C2.

One end of the first inductor L11 is connected to a connection point between the capacitor C1 and the capacitor C2. The other end of the first inductor L11 is connected to the ground. The capacitor C4 is connected in parallel with the first inductor L11.

The second high-pass filter 12 includes a second inductor L12 and capacitors C5, C6, C7, and C8. One end of the capacitor C5 is connected to the other end of the capacitor C2 of the first high-pass filter 11. One end of the capacitor C6 is connected to the other end of the capacitor C5.

One end of the capacitor C7 is connected to a connection point between the capacitor C2 and the capacitor C5. One end of the second inductor L12 is connected to the other end of the capacitor C7. The other end of the second inductor L12 is connected to the ground. The capacitor C8 is connected in parallel with the second inductor L12.

The low-pass filter 21 includes a fourth inductor L21 and capacitors C21, C22, and C23. One end of the capacitor C21 is connected to the other end of the capacitor C6 of the second high-pass filter 12. The fourth inductor L21 is connected in parallel with the capacitor C21.

One end of the capacitor C22 is connected to the one end of the capacitor C21. One end of the capacitor C23 is connected to the other end of the capacitor C21. The other end of each of the capacitors C22 and C23 is connected to the ground.

In FIG. 1, Lg denotes an inductance component of a path connecting each of the second inductor L12 and the capacitors C22 and C23 to the ground.

The third high-pass filter 13 includes a third inductor L13 and capacitors C9, C10, C11, and C12. One end of the capacitor C9 is connected to the other end of the capacitor C21 of the low-pass filter 21. One end of the capacitor C10 is connected to the other end of the capacitor C9. The other end of the capacitor C10 is connected to the second port 3. One end of the capacitor C11 is connected to one end of the capacitor C9. The other end of the capacitor C11 is connected to the other end of the capacitor C10.

One end of the third inductor L13 is connected to a connection point between the capacitor C9 and the capacitor C10. The other end of the third inductor L13 is connected to the ground. The capacitor C12 is connected in parallel with the third inductor L13.

Figure 2:
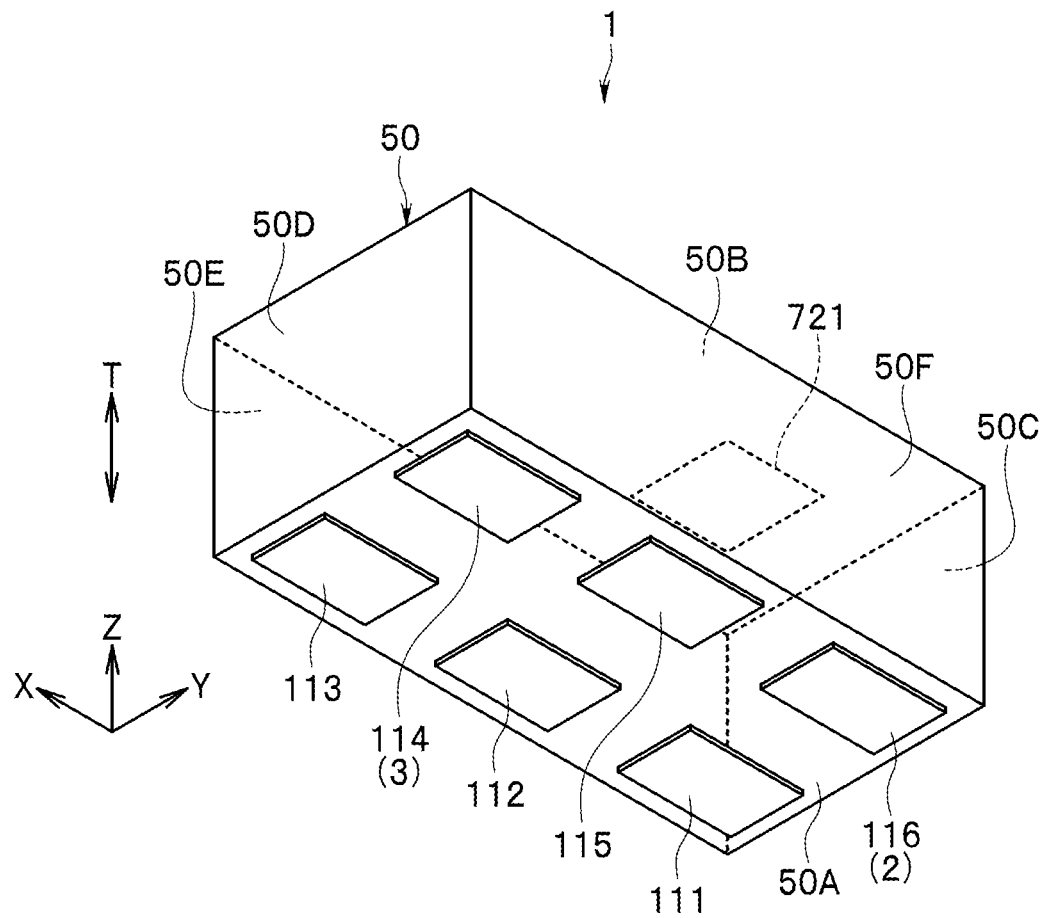
FIG. 2 is a perspective view showing an appearance of the band-pass filter according to the embodiment of the present invention.

Reference is now made to FIG. 2 to described other configurations of the band-pass filter 1. FIG. 2 is a perspective view showing an appearance of the band-pass filter 1.

The band-pass filter 1 further includes a stack 50 including a plurality of dielectric layers and a plurality of conductor layers stacked together. The first port 2, the second port 3, the first to third high-pass filters 11 to 13, and the low-pass filter 21 are integrated into the stack 50.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as —X, —Y, and —Z directions, respectively.

As shown in FIG. 2, the bottom surface 50A is located at the end of the stack 50 in the —Z direction. The top surface 50B is located at the end of the stack 50 in the Z direction. The bottom surface 50A and the top surface 50B each have a rectangular shape extending in the X direction. The side surface 50C is located at the end of the stack 50 in the —X direction. The side surface 50D is located at the end of the stack 50 in the X direction. The side surface 50E is located at the end of the stack 50 in the —Y direction. The side surface 50F is located at the end of the stack 50 in the Y direction.

The band-pass filter 1 further includes terminals 111, 112, 113, 114, 115, and 116 provided on the bottom surface 50A of the stack 50. The terminals 111, 112, and 113 are arranged in the X direction in this order at positions closer to the side surface 50E than the side surface 50F. The terminals 114, 115, and 116 are arranged in the —X direction in this order at positions closer to the side surface 50F than the side surface 50E.

The terminal 116 corresponds to the first port 2, and the terminal 114 corresponds to the second port 3. The first and second ports 2 and 3 are thus provided on the bottom surface 50A of the stack 50. Each of the terminals 111 to 113 and 115 is connected to the ground. The terminal 111 corresponds to a "first ground terminal" in the present invention. Each of the terminals 112 and 115 corresponds to a "second ground terminal" in the present invention. The terminal 113 corresponds to a "third ground terminal" in the present invention. The terminals 111 to 113 and 115 are disposed on an outer surface of the stack 50.

Reference is now made to FIG. 3A to FIG. 7B to describe an example of the plurality of dielectric layers and the plurality of conductor layers constituting the stack 50. In this example, the stack 50 includes twenty-two dielectric layers stacked together. The twenty-two dielectric layers will be referred to as a first to a twenty-second dielectric layer in the order from bottom to top. The first to twenty-second dielectric layers are denoted by reference numerals 51 to 72, respectively.

In FIG. 3A to FIG. 6C, each circle represents a through hole. The dielectric layers 51 to 70 each have a plurality of through holes. The through holes are each formed by filling a hole intended for a through hole with a conductive paste. Each of the plurality of through holes is connected to a terminal, a conductor layer, or another through hole.

Figure 3A:
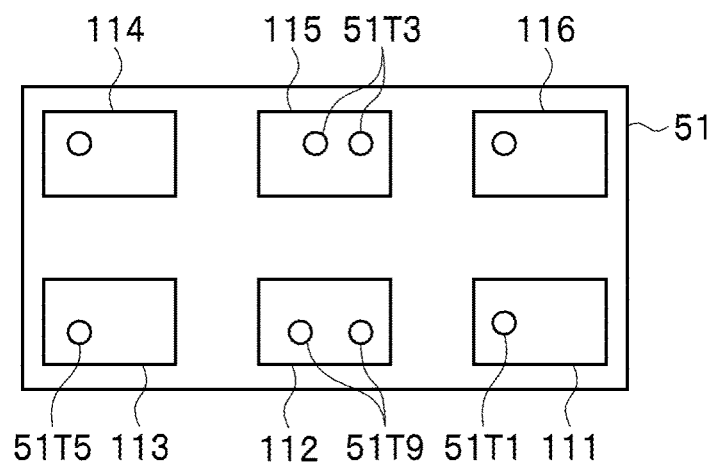
FIG. 3A to FIG. 3C are explanatory diagrams showing respective patterned surfaces of first to third dielectric layers of a stack of the band-pass filter according to the embodiment of the present invention.

FIG. 3A shows the patterned surface of the first dielectric layer 51. The terminals 111 to 116 are formed on the patterned surface of the dielectric layer 51. In FIG. 3A, a particular through hole connected to the terminal 111 is denoted by a reference numeral 51T1, two particular through holes connected to the terminal 112 are denoted by a reference numeral 51T9, a particular through hole connected to the terminal 113 is denoted by a reference numeral 51T5, and two particular through holes connected to the terminal 115 are denoted by a reference numeral 51T3.

Figure 3B:
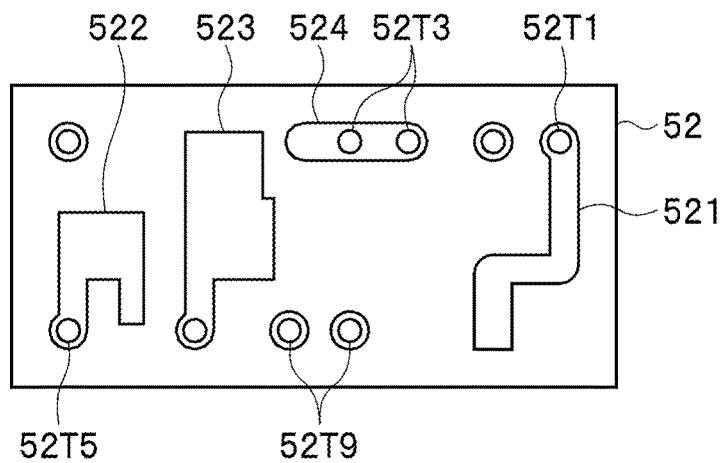

FIG. 3B shows the patterned surface of the second dielectric layer 52. Conductor layers 521, 522, 523, and 524 are formed on the patterned surface of the dielectric layer 52. The conductor layer 521 includes a first end and a second end located opposite to each other. The particular through hole 51T1 formed in the dielectric layer 51 is connected to a portion of the conductor layer 521 near the first end of the conductor layer 521. The two particular through holes 51T3 formed in the dielectric layer 51 are connected to the conductor layer 524. The particular through hole 51T5 formed in the dielectric layer 51 is connected to the conductor layer 522.

In FIG. 3B, a particular through hole connected to a portion of the conductor layer 521 near the second end of the conductor layer 521 is denoted by a reference numeral 52T1, and a particular through hole connected to the conductor layer 522 is denoted by a reference numeral 52T5. The two particular through holes connected to the two particular through holes 51T9 formed in the dielectric layer 51 are denoted by a reference numeral 52T9.

Figure 3C:
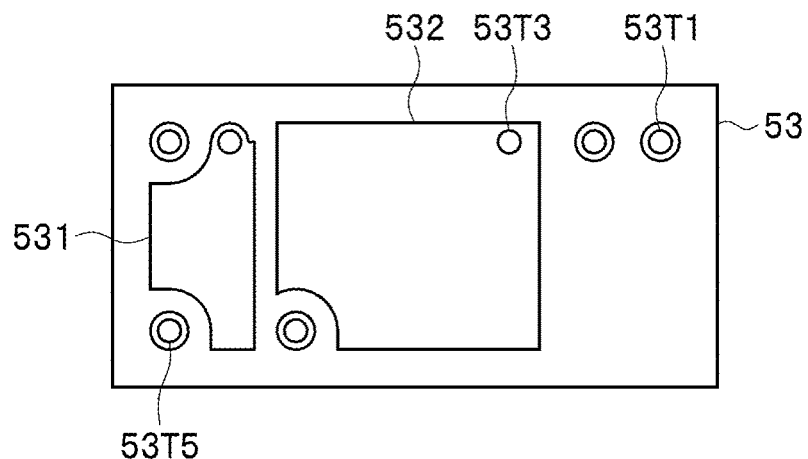

FIG. 3C shows the patterned surface of the third dielectric layer 53. Conductor layers 531 and 532 are formed on the patterned surface of the dielectric layer 53. The particular through holes 52T3 and 52T9 formed in the dielectric layer 52 are connected to the conductor layer 532.

In FIG. 3C, two respective particular through holes connected to the particular through holes 52T1 and 52T5 formed in the dielectric layer 52 are denoted by reference numerals 53T1 and 53T5. A particular through hole connected to the conductor layer 532 is denoted by a reference numeral 53T3.

Figure 4A:
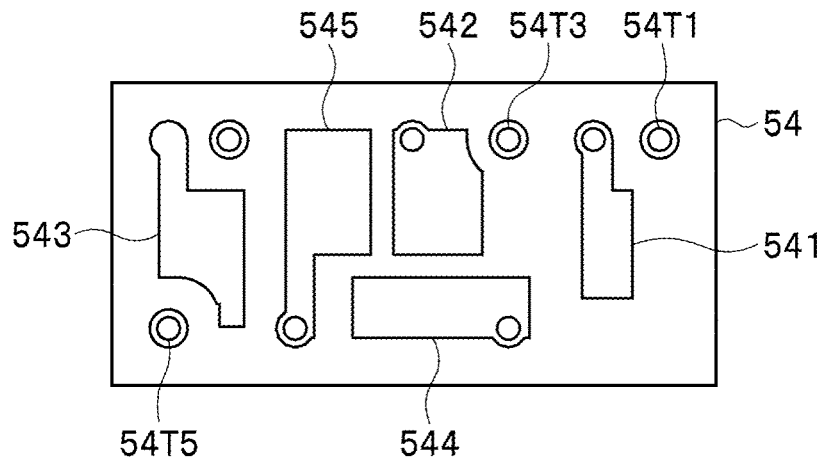
FIG. 4A to FIG. 4C are explanatory diagrams showing respective patterned surfaces of fourth to sixth dielectric layers of the stack of the band-pass filter according to the embodiment of the present invention.

FIG. 4A shows the patterned surface of the fourth dielectric layer 54. Conductor layers 541, 542, 543, 544, and 545 are formed on the patterned surface of the dielectric layer 54. In FIG. 4A, three respective particular through holes connected to the particular through holes 53T1, 53T3, and 53T5 formed in the dielectric layer 53 are denoted by reference numerals 54T1, 54T3, and 54T5.

Figure 4B:
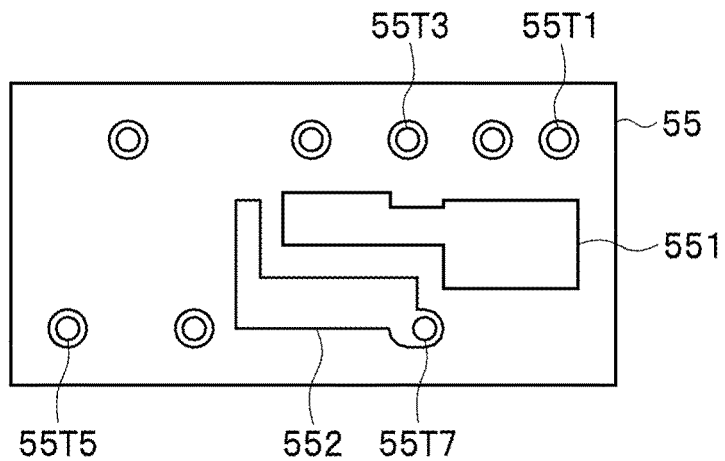

FIG. 4B shows the patterned surface of the fifth dielectric layer 55. Conductor layers 551 and 552 are formed on the patterned surface of the dielectric layer 55. In FIG. 4B, three respective particular through holes connected to the particular through holes 54T1, 54T3, and 54T5 formed in the dielectric layer 54 are denoted by reference numerals 55T1, 55T3, and 55T5. A particular through hole connected to the conductor layer 552 is denoted by a reference numeral 55T7.

Figure 4C:
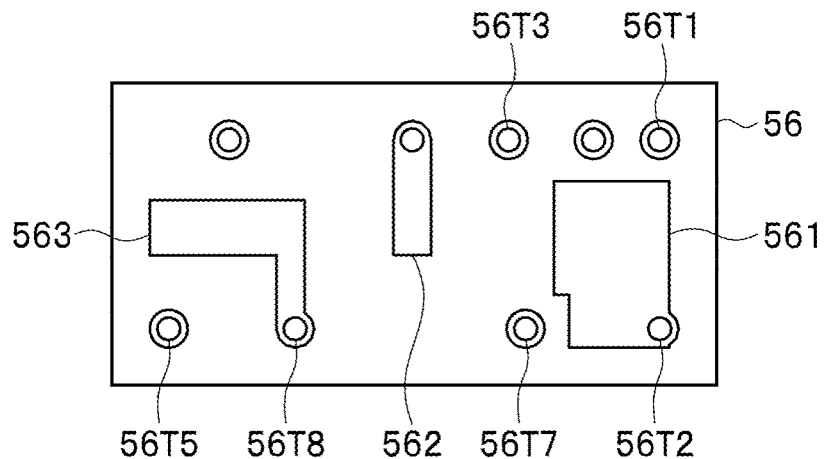

FIG. 4C shows the patterned surface of the sixth dielectric layer 56. Conductor layers 561, 562, and 563 are formed on the patterned surface of the dielectric layer 56. In FIG. 4C, four respective particular through holes connected to the particular through holes 55T1, 55T3, 55T5, and 55T7 formed in the dielectric layer 55 are denoted by reference numerals 56T1, 56T3, 56T5, and 56T7. Two respective particular through holes connected to the conductor layers 561 and 563 are denoted by reference numerals 56T2 and 56T8.

Figure 5A:
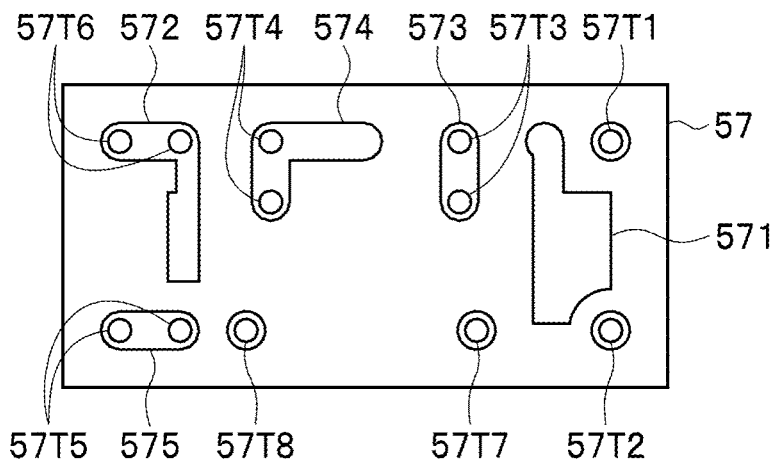
FIG. 5A to FIG. 5C are explanatory diagrams showing respective patterned surfaces of seventh to ninth dielectric layers of the stack of the band-pass filter according to the embodiment of the present invention.

FIG. 5A shows the patterned surface of the seventh dielectric layer 57. Conductor layers 571, 572, 573, 574, and 575 are formed on the patterned surface of the dielectric layer 57. The through holes 56T3 and 56T5 formed in the dielectric layer 56 are connected to the conductor layer 573 and 575, respectively.

In FIG. 5A, four respective particular through holes connected to the particular through holes 56T1, 56T2, 56T7, and 56T8 formed in the dielectric layer 56 are denoted by reference numerals 57T1, 57T2, 57T7, and 57T8. Two particular through holes connected to the conductor layer 573 are denoted by a reference numeral 57T3, two particular through holes connected to the conductor layer 574 are denoted by a reference numeral 57T4, two particular through holes connected to the conductor layer 575 are denoted by a reference numeral 57T5, and two particular through holes connected to the conductor layer 572 are denoted by a reference numeral 57T6.

Figure 5B:
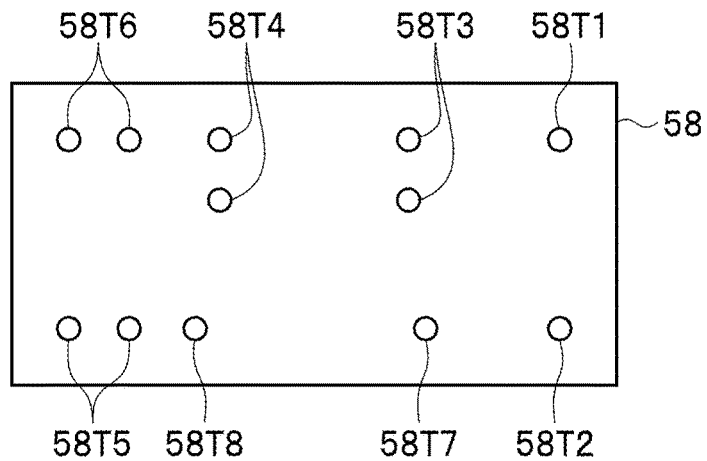

FIG. 5B shows the patterned surface of the eighth dielectric layer 58. Particular through holes 58T1, 58T2, 58T3, 58T4, 58T5, 58T6, 58T7, and 58T8 are formed in the dielectric layer 58. The particular through holes 57T1 to 57T8 formed in the dielectric layer 57 are connected to the particular through holes 58T1 to 58T8, respectively.

Figure 5C:
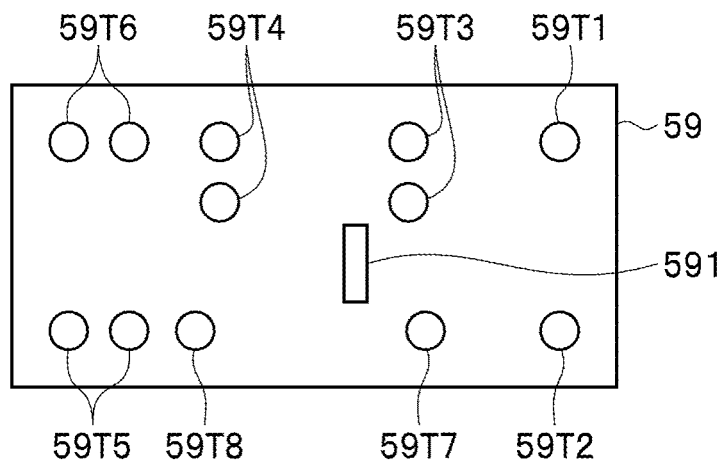

FIG. 5C shows the patterned surface of the ninth dielectric layer 59. A conductor layer 591 is formed on the patterned surface of the dielectric layer 59. Particular through holes 59T1, 59T2, 59T3, 59T4, 59T5, 59T6, 59T7, and 59T8 are formed in the dielectric layer 59. The particular through holes 58T1 to 58T8 formed in the dielectric layer 58 are connected to the particular through holes 59T1 to 59T8, respectively.

Figure 6A:
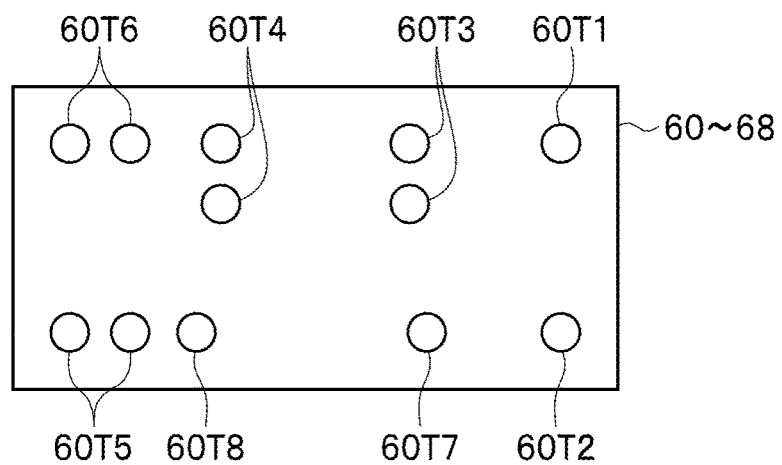
FIG. 6A is an explanatory diagram showing a patterned surface of each of tenth to eighteenth dielectric layers of the stack of the band-pass filter according to the embodiment of the present invention.

FIG. 6A shows the patterned surface of each of the tenth to eighteenth dielectric layers 60 to 68. Particular through holes 60T1, 60T2, 60T3, 60T4, 60T5, 60T6, 60T7, and 60T8 are formed in each of the dielectric layers 60 to 68. The particular through holes 59T1 to 59T8 formed in the dielectric layer 59 are connected respectively to the particular through holes 60T1 to 60T8 formed in the dielectric layer 60. In the dielectric layers 60 to 68, every vertically adjacent through holes are connected to each other.

Figure 6B:
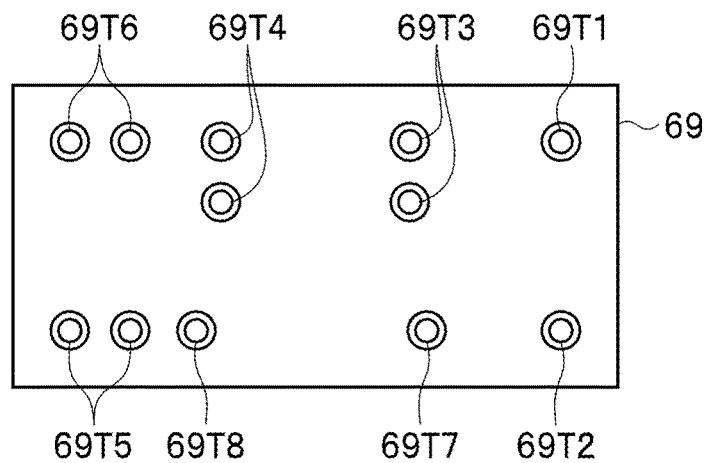
FIG. 6B is an explanatory diagram showing a patterned surface of a nineteenth dielectric layer of the stack of the band-pass filter according to the embodiment of the present invention.

FIG. 6B shows the patterned surface of the nineteenth dielectric layer 69. Particular through holes 69T1, 69T2, 69T3, 69T4, 69T5, 69T6, 69T7, and 69T8 are formed in the dielectric layer 69. The particular through holes 60T1 To 60T8 formed in the dielectric layer 68 are connected to the particular through holes 69T1 to 69T8, respectively.

Figure 6C:
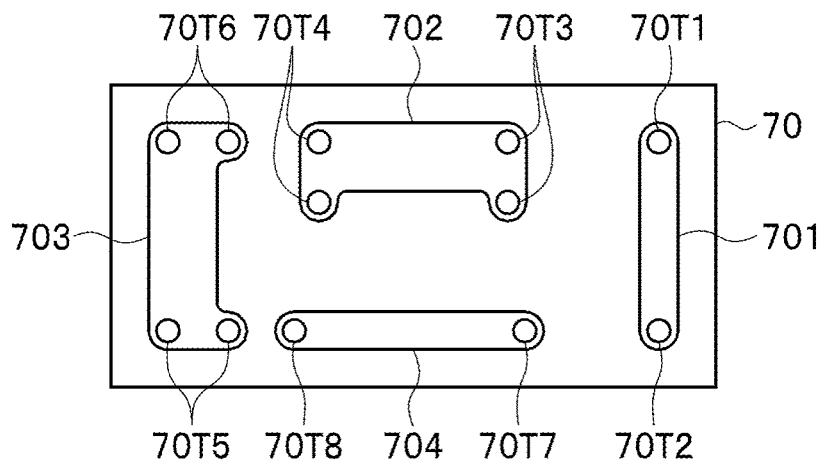
FIG. 6C is an explanatory diagram showing a patterned surface of a twentieth dielectric layer of the stack of the band-pass filter according to the embodiment of the present invention.

FIG. 6C shows the patterned surface of the twentieth dielectric layer 70. Inductor conductor layers 701, 702, 703, and 704 are formed on the patterned surface of the dielectric layer 70. Each of the conductor layers 701 to 704 includes a first end and a second end located opposite to each other. The particular through hole 69T1 formed in the dielectric layer 69 is connected to a portion of the conductor layer 701 near the first end of the conductor layer 701. The particular through hole 69T2 formed in the dielectric layer 69 is connected to a portion of the conductor layer 701 near the second end of the conductor layer 701. The two particular through holes 69T3 formed in the dielectric layer 69 are connected to a portion of the conductor layer 702 near the first end of the conductor layer 702. The two particular through holes 69T4 formed in the dielectric layer 69 are connected to a portion of the conductor layer 702 near the second end of the conductor layer 702. The two particular through holes 69T5 formed in the dielectric layer 69 are connected to a portion of the conductor layer 703 near the first end of the conductor layer 703. The two particular through holes 69T6 formed in the dielectric layer 69 are connected to a portion of the conductor layer 703 near the second end of the conductor layer 703. The particular through hole 69T7 formed in the dielectric layer 69 is connected to a portion of the conductor layer 704 near the first end of the conductor layer 704. The particular through hole 69T8 formed in the dielectric layer 69 is connected to a portion of the conductor layer 704 near the second end of the conductor layer 704.

In FIG. 6C, particular through holes are denoted as follows. A particular through hole connected to a portion of the conductor layer 701 near the first end of the conductor layer 701 is denoted by a reference numeral 70T1. A particular through hole connected to a portion of the conductor layer 701 near the second end of the conductor layer 701 is denoted by a reference numeral 70T2. Two particular through holes connected to a portion of the conductor layer 702 near the first end of the conductor layer 702 are denoted by a reference numeral 70T3. Two particular through holes connected to a portion of the conductor layer 702 near the second end of the conductor layer 702 are denoted by a reference numeral 70T4. Two particular through holes connected to a portion of the conductor layer 703 near the first end of the conductor layer 703 are denoted by a reference numeral 70T5. Two particular through holes connected to a portion of the conductor layer 703 near the second end of the conductor layer 703 are denoted by a reference numeral 70T6. A particular through hole connected to a portion of the conductor layer 704 near the first end of the conductor layer 704 is denoted by a reference numeral 70T7. Two particular through holes connected to a portion of the conductor layer 704 near the second end of the conductor layer 704 are denoted by a reference numeral 70T8.

Figure 7A:
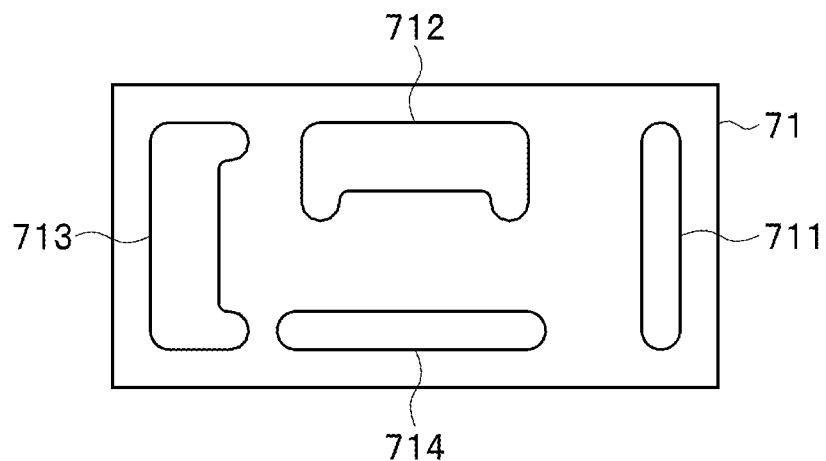
FIG. 7A and FIG. 7B are explanatory diagrams showing respective patterned surfaces of twenty-first and twenty-second dielectric layers of the stack of the band-pass filter according to the embodiment of the present invention.

FIG. 7A shows the patterned surface of the twenty-first dielectric layer 71. Inductor conductor layers 711, 712, 713, and 714 are formed on the patterned surface of the dielectric layer 71. Each of the conductor layers 711 to 714 includes a first end and a second end located opposite to each other. The particular through hole 70T1 formed in the dielectric layer 70 is connected to a portion of the conductor layer 711 near the first end of the conductor layer 711. The particular through hole 70T2 formed in the dielectric layer 70 is connected to a portion of the conductor layer 711 near the second end of the conductor layer 711. The two particular through holes 70T3 formed in the dielectric layer 70 are connected to a portion of the conductor layer 712 near the first end of the conductor layer 712. The two particular through holes 70T4 formed in the dielectric layer 70 are connected to a portion of the conductor layer 712 near the second end of the conductor layer 712. The two particular through holes 70T5 formed in the dielectric layer 70 are connected to a portion of the conductor layer 713 near the first end of the conductor layer 713. The two particular through holes 70T6 formed in the dielectric layer 70 are connected to a portion of the conductor layer 713 near the second end of the conductor layer 713. The particular through hole 70T7 formed in the dielectric layer 70 is connected to a portion of the conductor layer 714 near the first end of the conductor layer 714. The particular through hole 70T8 formed in the dielectric layer 70 is connected to a portion of the conductor layer 714 near the second end of the conductor layer 714.

Figure 7B:
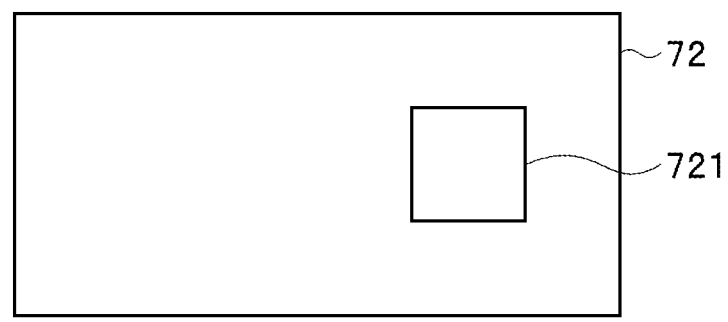

FIG. 7B shows the patterned surface of the twenty-second dielectric layer 72. A mark 721 made of a conductor layer is formed on the patterned surface of the dielectric layer 72.

The stack 50 shown in FIG. 2 is formed by stacking the first to twenty-second dielectric layers 51 to 72 such that the patterned surface of the first dielectric layer 51 serves as the bottom surface 50A of the stack 50 and the surface of the twenty-second dielectric layer 72 opposite to the patterned surface thereof serves as the top surface 50B of the stack 50.

Each of the plurality of through holes shown in FIG. 3A to FIG. 4C excluding the plurality of particular through holes denoted by the reference numerals is connected to, when the first to twenty-second dielectric layers 51 to 72 are stacked, a conductor layer overlapping the through hole in the stacking direction T or another through hole overlapping the through hole in the stacking direction T. Of the plurality of through holes shown in FIG. 3A to FIG. 4C excluding the plurality of particular through holes, the ones located within a terminal or a conductor layer are connected to the terminal or conductor layer.

Figure 8:
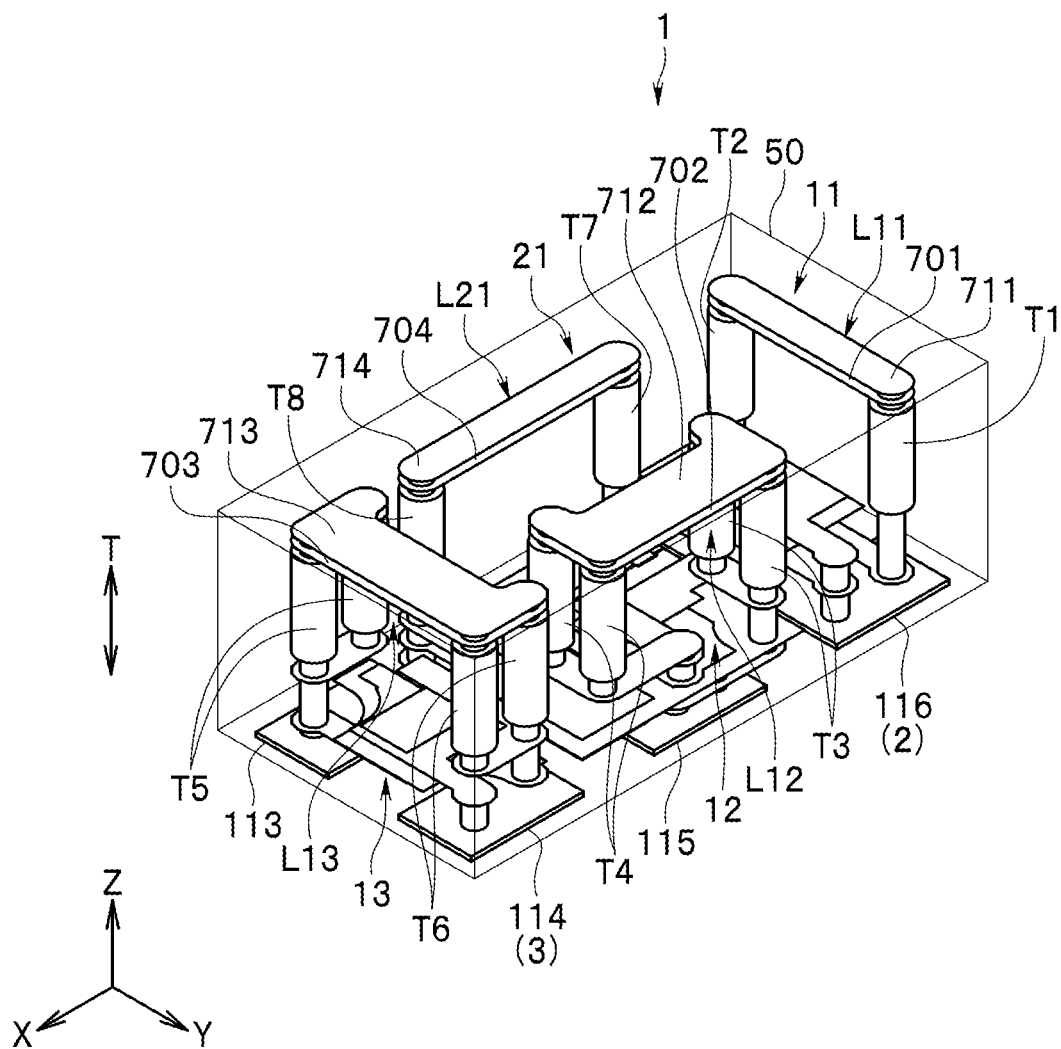
FIG. 8 is a perspective view showing inside of the stack of the band-pass filter according to the embodiment of the present invention.

FIG. 8 shows inside of the stack 50 formed by stacking the first to twenty-second dielectric layers 51 to 72. As shown in FIG. 8, the plurality of conductor layers and the plurality of through holes shown in FIG. 3A to FIG. 7A are stacked together inside the stack 50. Note that, in FIG. 8, the mark 721 is omitted.

Correspondences between the components of the circuit of the band-pass filter 1 shown in FIG. 1 and the internal components of the stack 50 shown in FIG. 3A to FIG. 7A will now be described. First, the components of the first high-pass filter 11 will be described. The first inductor L11 is composed of the inductor conductor layers 701 and 711 and the particular through holes 52T1, 53T1, 54T1, 55T1, 56T1, 56T2, 57T1, 57T2, 58T1, 58T2, 59T1, 59T2, 60T1, 60T2, 69T1, 69T2, 70T1, and 70T2.

The capacitor C1 is composed of the conductor layers 561 and 571 and the dielectric layer 56 interposed between those conductor layers. The capacitor C2 is composed of the conductor layers 551 and 561 and the dielectric layer 55 interposed between those conductor layers. The capacitor C3 is composed of the conductor layers 541 and 551 and the dielectric layer 54 interposed between those conductor layers. The capacitor C4 is composed of the conductor layers 521 and 561 and the dielectric layers 52 to 55 interposed between those conductor layers.

Next, the components of the second high-pass filter 12 will be described. The second inductor L12 is composed of the inductor conductor layers 702 and 712 and the particular through holes 57T3, 57T4, 58T3, 58T4, 59T3, 59T4, 60T3, 60T4, 69T3, 69T4, 70T3, and 70T4.

The capacitor C5 is composed of the conductor layers 551 and 591 and the dielectric layers 55 to 58 interposed between those conductor layers. The capacitor C6 is composed of the conductor layers 552 and 591 and the dielectric layers 55 to 58 interposed between those conductor layers. The capacitor C7 is composed of the conductor layers 542, 551, and 562 and the dielectric layers 54 and 55 interposed between those conductor layers. The capacitor C8 is composed of the conductor layers 532 and 542 and the dielectric layer 53 interposed between those conductor layers.

Next, the components of the third high-pass filter 13 will be described. The third inductor L13 is composed of the inductor conductor layers 703 and 713 and the particular through holes 57T5, 57T6, 58T5, 58T6, 59T5, 59T6, 60T5, 60T6, 69T5, 69T6, 70T5, and 70T6.

The capacitor C9 is composed of the conductor layers 563 and 572 and the dielectric layer 56 interposed between those conductor layers. The capacitor C10 is composed of the conductor layers 531 and 543 and the dielectric layer 53 interposed between those conductor layers. The capacitor C11 is composed of the conductor layers 543 and 563 and the dielectric layers 54 and 55 interposed between those conductor layers. The capacitor C12 is composed of the conductor layers 522 and 531 and the dielectric layer 52 interposed between those conductor layers.

Next, the components of the low-pass filter 21 will be described. The fourth inductor L21 is composed of the inductor conductor layers 704 and 714 and the particular through holes 55T7, 56T7, 56T8, 57T7, 57T8, 58T7, 58T8, 59T7, 59T8, 60T7, 60T8, 69T7, 69T8, 70T7, and 70T8.

The capacitor C21 is composed of the conductor layers 545 and 552 and the dielectric layer 54 interposed between those conductor layers. The capacitor C22 is composed of the conductor layers 532 and 544 and the dielectric layer 53 interposed between those conductor layers. The capacitor C23 is composed of the conductor layers 523, 532, and 545 and the dielectric layers 52 and 53 interposed between those conductor layers.

The inductance component Lg shown in FIG. 1 includes the inductance component of each of the conductor layer 524 and the particular through holes 51T3, 51T9, 52T3, and 52T9.

Figure 9:
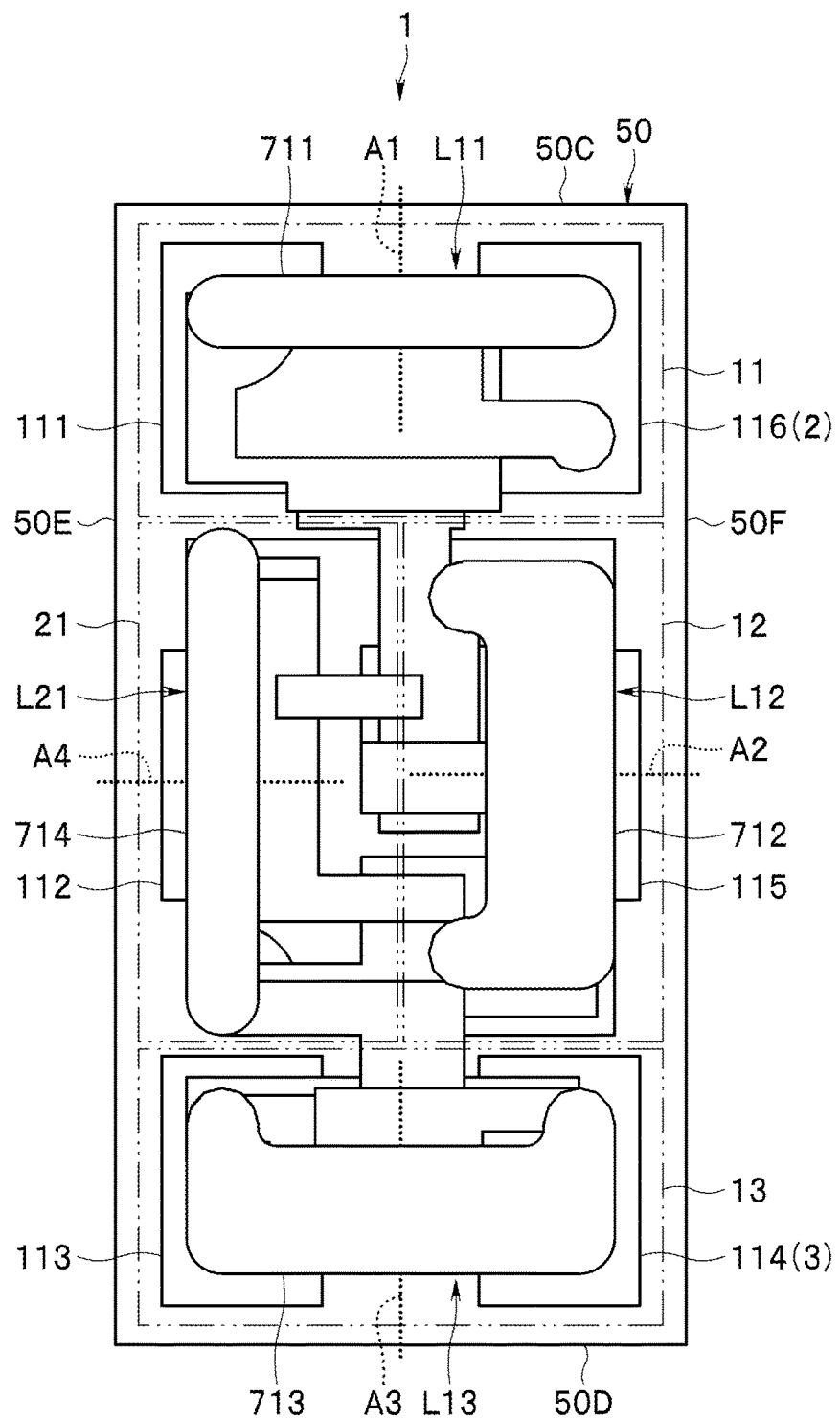
FIG. 9 is a plan view showing the inside of the stack of the band-pass filter according to the embodiment of the present invention.

Reference is now made to FIG. 1 to FIG. 9 to describe structural features of the band-pass filter 1 according to the present embodiment. FIG. 9 is a plan view showing the inside of the stack 50.

First, features related to arrangement of the first to third high-pass filters 11 to 13 and the low-pass filter 21 will be described. As shown in FIG. 9, the third high-pass filter 13 is not adjacent to the first high-pass filter 11 in the stack 50. In the present embodiment, the first high-pass filter 11 is arranged at a position closer to the side surface 50C than the side surface 50D. The third high-pass filter 13 is arranged at a position closer to the side surface 50D than the side surface 50C.

The second high-pass filter 12 is arranged between the first high-pass filter 11 and the third high-pass filter 13 in the stack 50. The low-pass filter 21 is arranged between the first high-pass filter 11 and the third high-pass filter 13 in the stack 50. In the present embodiment, the second high-pass filter 12 is arranged between the first high-pass filter 11 and the third high-pass filter 13 at a position closer to the side surface 50F than the side surface 50E. The low-pass filter 21 is arranged between the first high-pass filter 11 and the third high-pass filter 13 at a position closer to the side surface 50E than the side surface 50F.

Next, structural features of the first to fourth inductors L11 to L13 and L21 will be described. Here, a structure formed by connecting two or more through holes in series is referred to as a through hole line. The stack 50 includes through hole lines T1, T2, T3, T4, T5, T6, T7, and T8. The through hole line T1 is composed of the particular through holes 52T1, 53T1, 54T1, 55T1, 56T1, 57T1, 58T1, 59T1, 60T1, and 69T1. The through hole line T2 is composed of the particular through holes 56T2, 57T2, 58T2, 59T2, 60T2, and 69T2.

The two through hole lines T3 are composed of the particular through holes 57T3, 58T3, 59T3, 60T3, and 69T3. The two through hole lines T4 are composed of the particular through holes 57T4, 58T4, 59T4, 60T4, and 69T4. The two through hole lines T5 are composed of the particular through holes 57T5, 58T5, 59T5, 60T5, and 69T5. The two through hole lines T6 are composed of the particular through holes 57T6, 58T6, 59T6, 60T6, and 69T6.

The through hole line T7 is composed of the particular through holes 55T7, 56T7, 57T7, 58T7, 59T7, 60T7, and 69T7. The through hole line T8 is composed of the particular through holes 56T8, 57T8, 58T8, 59T8, 60T8, and 69T8.

The first inductor L11 includes the inductor conductor layers 701 and 711, the through hole lines T1 and T2, and the particular through holes 70T1 and 70T2. The through hole line T1 is connected to a portion of the inductor conductor layer 701 near the first end of the inductor conductor layer 701. The through hole line T2 is connected to a portion of the inductor conductor layer 701 near the second end of the inductor conductor layer 701.

The second inductor L12 includes the inductor conductor layers 702 and 712, the two through hole lines T3, the two through hole lines T4, and the particular through holes 70T3 and 70T4. The two through hole lines T3 are connected in parallel to a portion of the inductor conductor layer 702 near the first end of the inductor conductor layer 702. The two through hole lines T4 are connected in parallel to a portion of the inductor conductor layer 702 near the second end of the inductor conductor layer 702.

The third inductor L13 includes the inductor conductor layers 703 and 713, the two through hole lines T5, the two through hole lines T6, and the particular through holes 70T5 and 70T6. The two through hole lines T5 are connected in parallel to a portion of the inductor conductor layer 703 near the first end of the inductor conductor layer 703. The two through hole lines T6 are connected in parallel to a portion of the inductor conductor layer 703 near the second end of the inductor conductor layer 703.

The fourth inductor L21 includes the inductor conductor layers 704 and 714, the through hole lines T7 and T8, and the particular through holes 70T7 and 70T8. The through hole line T7 is connected to a portion of the inductor conductor layer 704 near the first end of the inductor conductor layer 704. The through hole line T8 is connected to a portion of the inductor conductor layer 704 near the second end of the inductor conductor layer 704.

The first inductor L11 is wound around a first axis A1. The second inductor L12 is wound around a second axis A2. The third inductor L13 is wound around a third axis A3. The fourth inductor L21 is wound around a fourth axis A4.

The first axis A1 and the second axis A2 extend in directions different from each other. In the example shown in FIG. 9, the first axis A1 extends in a direction parallel to the X direction, and the second axis A2 extends in a direction parallel to the Y direction. Note that at least one of the first and second axes A1 and A2 may extend in a direction inclined with respect to each of the X direction and the Y direction as long as the requirement is satisfied that the first axis A1 and the second axis A2 extend in directions different from each other.

The second axis A2 and the third axis A3 extend in directions different from each other. In the example shown in FIG. 9, the third axis A3 extends in a direction parallel to the X direction. Note that at least one of the second and third axes A2 and A3 may extend in a direction inclined with respect to each of the X direction and the Y direction as long as the requirement is satisfied that the second axis A2 and the third axis A3 extend in directions different from each other.

The fourth axis A4 extends in a direction different from the direction of each of one or two of the first to third axes A1 to A3. In the example shown in FIG. 8 and FIG. 9, the fourth axis A4 extends in a direction parallel to the Y direction. Hence, the fourth axis A4 is parallel to the second axis A2 while extending in a direction different from the directions of the first and third axes A1 and A3.

Note that, in the example shown in FIG. 8 and FIG. 9, the first axis A1 and the third axis A3 both extend in a direction parallel to the X direction. However, the first axis A1 and the third axis A3 may extend in directions different from each other. In the example shown in FIG. 8 and FIG. 9, the second axis A2 and the fourth axis A4 both extend in a direction parallel to the Y direction. However, the second axis A2 and the fourth axis A4 may extend in directions different from each other.

In the example shown in FIG. 8 and FIG. 9, the first to fourth axes A1 to A4 are all orthogonal to the stacking direction T. Note that at least one of the first to fourth axes A1 to A4 may be parallel to the stacking direction T.

Next, features related to connection of the first to third high-pass filters 11 to 13 and the ground will be described. The first high-pass filter 11 is electrically connected to the terminal 111. In other words, the through hole line T1 of the first inductor L11 is connected to the conductor layer 521 constituting the capacitor C4. The conductor layer 521 is connected to the terminal 111 via the particular through hole 51T1.

The second high-pass filter 12 is electrically connected to the terminals 112 and 115. In other words, the two through hole lines T3 of the second inductor L12 are connected to the conductor layer 532 constituting the capacitor C8 via the conductor layer 573 and the particular through holes 53T3, 54T3, 55T3, and 56T3. The conductor layer 532 is connected to the terminal 112 via the particular through holes 51T9 and 52T9 and is also connected to the terminal 115 via the two particular through holes 51T3, the conductor layer 524, and the two particular through holes 52T3.

The third high-pass filter 13 is electrically connected to the terminal 113. In other words, the two through hole lines T5 of the third inductor L13 are connected to the conductor layer 522 constituting the capacitor C12 via the conductor layer 575 and the particular through holes 52T5, 53T5, 54T5, 55T5, and 56T5. The conductor layer 522 is connected to the terminal 113 via the particular through hole 5IT5.

The terminals 111 to 113 and 115 connected to the ground are separated from each other on the bottom surface 50A of the stack 50. The terminals 111 to 113 and 115 are not electrically connected to each other in the stack 50. Hence, the first to third high-pass filters 11 to 13 do not physically share the ground in the stack 50.

Note that, in the present embodiment, the second high-pass filter 12 and the low-pass filter 21 are both electrically connected to the terminals 111 and 115. The conductor layer 532 configures the capacitor C8 of the second high-pass filter 12 and also configures the capacitors C22 and C23 of the low-pass filter 21. As described above, the conductor layer 532 is connected to the terminals 111 and 115.

In the present embodiment, as described above, the ground-side ends of the first to third inductors L11 to L13 are each electrically connected to a different terminal and are not electrically connected to each other in the stack 50. As shown in FIG. 1, the plurality of capacitors are present between the end of one of the first to third inductors L11 to L13 opposite to the ground and the end of one of the others of the first to third inductors L11 to L13 opposite to the ground. Hence, the ends of the first to third inductors L11 to L13 opposite to the ground are not electrically connected to each other in the stack 50. With these configurations, the first to third inductors L11 to L13 are not electrically connected to each other in the stack 50.

Figure 10:
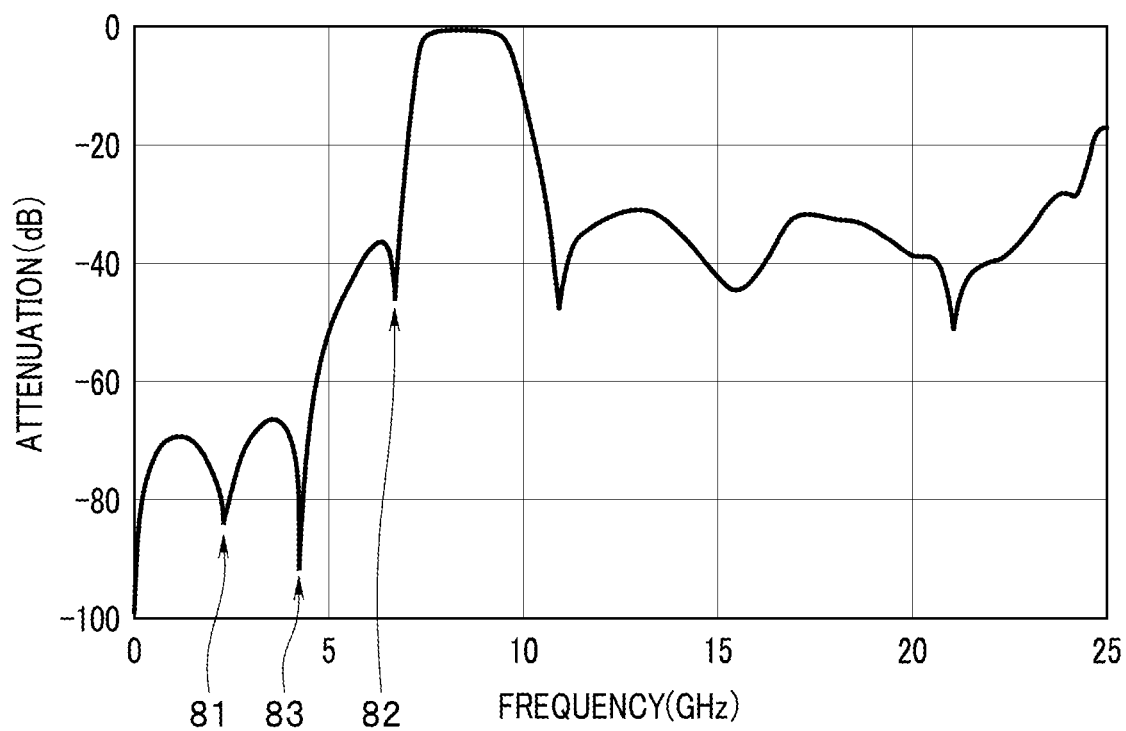
FIG. 10 is a characteristic chart showing an example of pass attenuation characteristics of the band-pass filter according to the embodiment of the present invention.

Reference is now made to FIG. 10 to describe an example of the characteristics of the band-pass filter 1. FIG. 10 is a characteristic chart showing an example of pass attenuation characteristics of the band-pass filter 1. In FIG. 10, the horizontal axis represents frequency, and the vertical axis represents attenuation.

As shown in FIG. 10, in the band-pass filter 1, three attenuation poles 81, 82, and 83 are formed on a low-pass side of the passband of the band-pass filter 1 in the pass attenuation characteristics of the band-pass filter 1. The attenuation pole 81 is an attenuation pole formed by the first high-pass filter 11. The attenuation pole 82 is an attenuation pole formed by the second high-pass filter 12. The attenuation pole 83 is an attenuation pole formed by the third high-pass filter 13. As shown in FIG. 10, the attenuation pole 82 is formed near the passband, while the attenuation poles 81 and 83 are formed on a lower frequency band compared to the attenuation pole 82. In other words, the frequency of the attenuation pole 82 is higher than the frequency of each of the attenuation poles 81 and 83.

In the example shown in FIG. 10, the frequency of the attenuation pole 81 and the frequency of the attenuation pole 83 are different from each other. In the example shown in FIG. 10, in particular, the frequency of the attenuation pole 83 is higher than the frequency of the attenuation pole 81.

Now, the operation and effects of the band-pass filter 1 according to the present embodiment will be described. In the present embodiment, the first high-pass filter 11 forms the attenuation pole 81, the second high-pass filter 12 forms the attenuation pole 82, and the third high-pass filter 13 forms the attenuation pole 83.

Here, focus is placed on two resonant circuits physically adjacent to each other in a band-pass filter. In general, when a band-pass filter is miniaturized, the gap between two resonant circuits is reduced, which is likely to cause the two resonant circuits to be magnetically coupled with each other. When the two resonant circuits magnetically couple with each other, in a case where the two resonant circuits form two adjacent attenuation poles in the pass attenuation characteristics of the band-pass filter, the pass attenuation between the two attenuation poles is reduced in the pass attenuation characteristics of the band-pass filter.

In the present embodiment, the second high-pass filter 12 is arranged between the first high-pass filter 11 and the third high-pass filter 13 in the circuit configuration. With this arrangement, if the attenuation pole formed by the second high-pass filter 12 is present between the attenuation pole formed by the first high-pass filter 11 and the attenuation pole formed by the third high-pass filter 13 and the second high-pass filter 12 is magnetically coupled with both the first high-pass filter 11 and the third high-pass filter 13, the pass attenuation between the attenuation pole formed by the first high-pass filter 11 and the attenuation pole formed by the second high-pass filter 12 and the pass attenuation between the attenuation pole formed by the second high-pass filter 12 and the attenuation pole formed by the third high-pass filter 13 are reduced in the pass attenuation characteristics of the band-pass filter 1. This consequently reduces the pass attenuation in a large frequency region on a low-pass side of the passband.

In contrast to this, in the present embodiment, the attenuation pole 82 formed by the second high-pass filter 12 is not present between the attenuation pole 81 formed by the first high-pass filter 11 and the attenuation pole 83 formed by the third high-pass filter 13, and hence the frequency of the attenuation pole 82 is higher than the frequency of each of the attenuation poles 81 and 83. Hence, according to the present embodiment, it is possible to suppress reduction of the pass attenuation in the large frequency region on the low-pass side of the passband, which consequently increases the pass attenuation on the low-pass side of the passband.

Note that, the frequency of the attenuation pole 81 and the frequency of the attenuation pole 83 are different from each other. The frequency of the attenuation pole 83 may be higher than or lower than the frequency of the attenuation pole 81. When the frequency of the attenuation pole 83 is higher than the frequency of the attenuation pole 81, the attenuation poles 82 and 83 correspond to two attenuation poles adjacent to each other in the pass attenuation characteristics of the band-pass filter described above. In the present embodiment, the low-pass filter 21 is provided between the second high-pass filter 12 and the third high-pass filter 13 in the circuit configuration. With this configuration, according to the present embodiment, the path from the second high-pass filter 12 to the third high-pass filter 13 is increased in length, and this can suppress or prevent magnetic coupling between the second high-pass filter 12 and the third high-pass filter 13. Consequently, according to the present embodiment, it is possible to suppress reduction of the pass attenuation between the attenuation pole 82 and the attenuation pole 83 in the pass attenuation characteristics of the band-pass filter 1.

Moreover, in the present embodiment, the third high-pass filter 13 is not adjacent to the first high-pass filter 11 in the stack 50. With this configuration, according to the present embodiment, it is possible to suppress or prevent magnetic coupling between the first high-pass filter 11 and the third high-pass filter 13. Consequently, according to the present embodiment, it is possible to suppress reduction of the pass attenuation between the attenuation pole 81 and the attenuation pole 83 in the pass attenuation characteristics of the band-pass filter 1.

Moreover, in the present embodiment, the first to third high-pass filters 11 to 13 do not physically share the ground in the stack 50. With this configuration, according to the present embodiment, it is possible for the first to third high-pass filters 11 to 13 to prevent magnetic coupling via the ground in the stack 50. Also with this configuration, according to the present embodiment, it is possible to suppress reduction of the pass attenuation on the low-pass side of the passband.

Moreover, according to the present embodiment, the first to third inductors L11 to L13 are not electrically connected to each other in the stack 50. With this configuration, according to the present embodiment, it is possible for the first to third inductors L11 to L13 to prevent magnetic coupling via the conductors (conductor layers and through holes) in the stack 50. Also with this configuration, according to the present embodiment, it is possible to suppress reduction of the pass attenuation on the low-pass side of the passband.

Here, a region surrounded by the inductor conductor layer 701 and the through hole lines T1 and T2 is referred to as an opening of the first inductor L11. A region surrounded by the inductor conductor layer 702 and the through hole lines T3 and T4 is referred to as an opening of the second inductor L12. A region surrounded by the inductor conductor layer 703 and the through hole lines T5 and T6 is referred to as an opening of the third inductor L13.

In the present embodiment, the first inductor L11 is wound around the first axis A1, the second inductor L12 is wound around the second axis A2, and the third inductor L13 is wound around the third axis A3. As described above, the first axis A1 and the second axis A2 extend in directions different from each other. With this configuration, according to the present embodiment, it is possible to suppress magnetic coupling between the first inductor L11 and the second inductor L12 compared to a case where the first axis A1 and the second axis A2 extend in the same direction and the opening of the first inductor L11 and the opening of the second inductor L12 face each other. Similarly, in the present embodiment, the second axis A2 and the third axis A3 extend in directions different from each other. With this configuration, according to the present embodiment, it is possible to suppress magnetic coupling between the second inductor L12 and the third inductor L13 compared to a case where the second axis A2 and the third axis A3 extend in the same direction and the opening of the second inductor L12 and the opening of the third inductor L13 face each other. In view of the above, according to the present embodiment, it is possible to suppress reduction of the pass attenuation on the low-pass side of the passband.

Next, results of a simulation for investigating an influence of the frequency of the attenuation pole formed by each of the first to third high-pass filters 11 to 13 on the pass attenuation characteristics of the band-pass filter 1 will be described. In the simulation, a model of a first example, a model of a second example, and a model of a comparative example were used. The model of the first example and the model of the second example are both models of the band-pass filter 1 according to the present embodiment. The model of the comparative example is a model of a band-pass filter of the comparative example. A circuit configuration of the band-pass filter of the comparative example is the same as the circuit configuration of the band-pass filter 1 according to the present embodiment.

The models used in the simulation are each a model obtained by combining structural models and circuit models. The structural models are models of the first to fourth inductors L11 to L13 and L21 each composed of two inductor conductor layers and a plurality of through holes (refer to FIG. 8). The circuit models are models of the capacitors C1 to C12 and C21 to C23 each composed of an ideal capacitor.

In the following description, an attenuation pole formed by the first high-pass filter 11 is referred to as a first attenuation pole 91, an attenuation pole formed by the second high-pass filter 12 is referred to as a second attenuation pole 92, and an attenuation pole formed by the third high-pass filter 13 is referred to as a third attenuation pole 93. In the model of the first example, the first to third high-pass filters 11 to 13 were designed so that the frequencies were higher in the order of the first attenuation pole 91, the third attenuation pole 93, and the second attenuation pole 92. In the model of the second example, the first to third high-pass filters 11 to 13 were designed so that the frequencies were higher in the order of the third attenuation pole 93, the first attenuation pole 91, and the second attenuation pole 92. In the model of the comparative example, the first to third high-pass filters 11 to 13 were designed so that the frequencies were higher in the order the third attenuation pole 93, the second attenuation pole 92, and the first attenuation pole 91.

In the models of the first and second examples, the requirement of the band-pass filter 1 according to the present embodiment is satisfied that the frequency of the attenuation pole formed by the second high-pass filter 12 is higher than the frequency of the attenuation pole formed by each of the first and third high-pass filters 11 and 13. In contrast, in the model of the comparative example, the above requirement is not satisfied.

Figure 11:
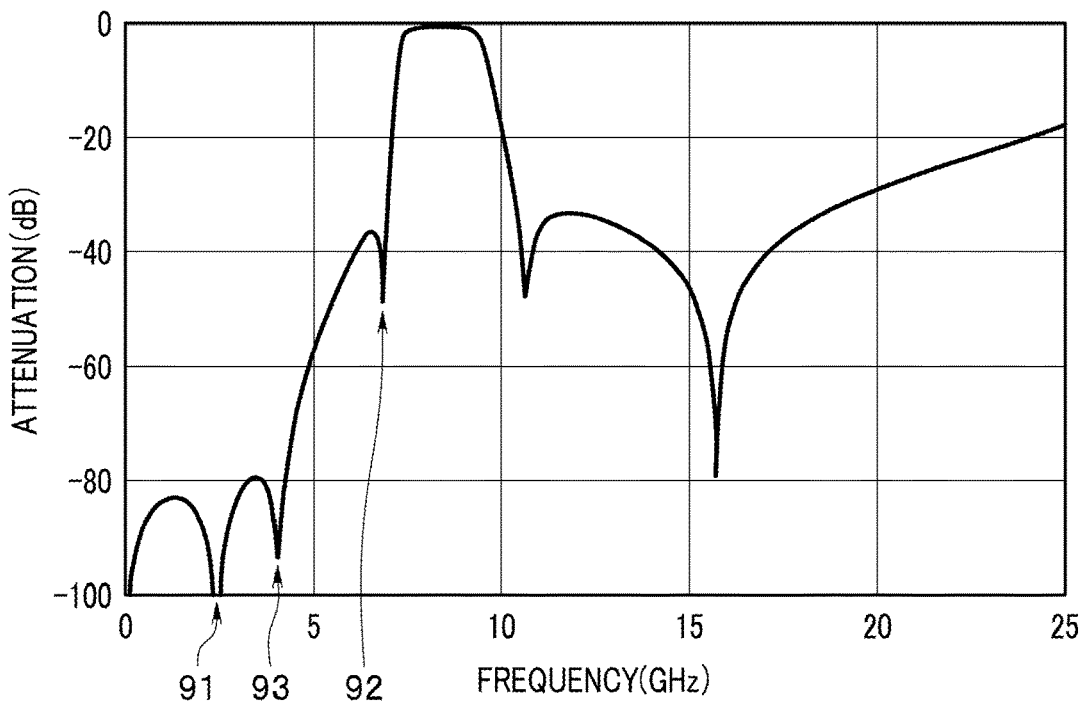
FIG. 11 is a characteristic chart showing pass attenuation characteristics of a model of a first example.
Figure 12:
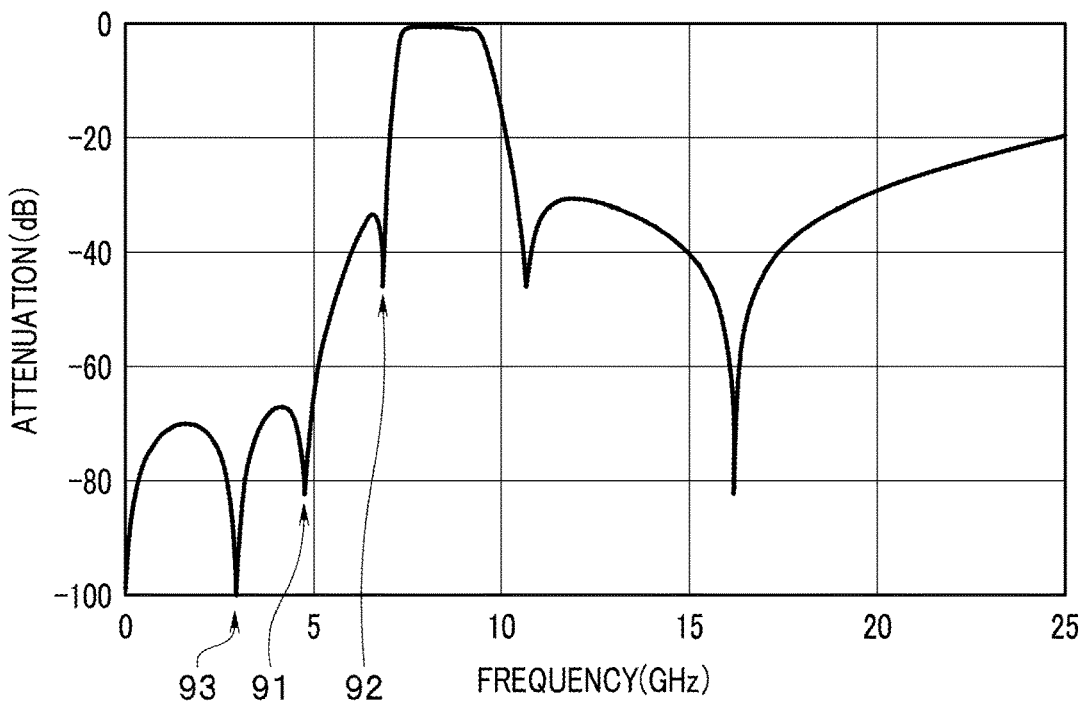
FIG. 12 is a characteristic chart showing pass attenuation characteristics of a model of a second example.
Figure 13:
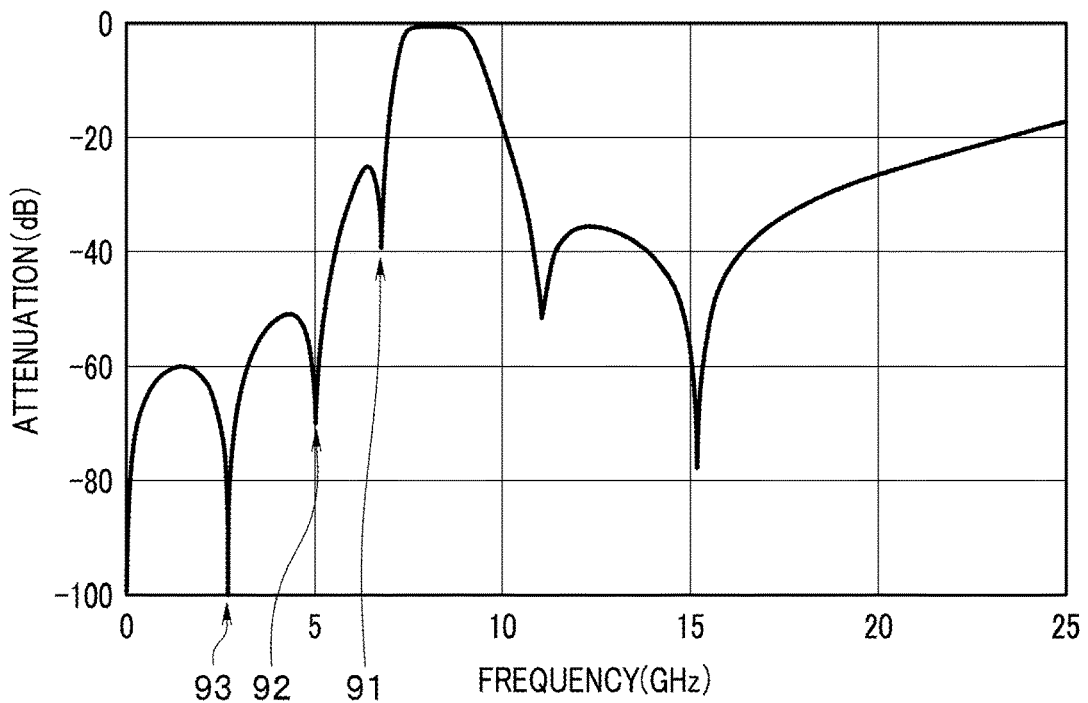
FIG. 13 is a characteristic chart showing pass attenuation characteristics of a model of a comparative example.

In the simulation, pass attenuation characteristics were investigated for each of the model of the first example, the model of the second example, and the model of the comparative example. FIG. 11 shows pass attenuation characteristics of the model of the first example. FIG. 12 shows pass attenuation characteristics of the model of the second example. FIG. 13 shows pass attenuation characteristics of the model of the comparative example. In FIG. 11 to FIG. 13, the horizontal axis represents frequency, and the vertical axis represents attenuation. Here, the absolute value of attenuation shown in each of FIG. 11 to FIG. 13 is referred to as pass attenuation. As understood from FIG. 11 to FIG. 13, the pass attenuation on the low-pass side of the passband is larger in the models of the first and second examples than that in the model of the comparative example.

The pass attenuation is required to be 60 dB or more in a frequency region of 4.5 GHz or lower, for example. Although the above requirement is satisfied in the model of the first example and the model of the second example, the above requirement is not satisfied in the model of the comparative example.

As understood from the results of the simulation, according to the present embodiment, the above-described requirement of the band-pass filter 1 is satisfied, and hence it is possible to increase the pass attenuation on the low-pass side of the passband.

[Variation]

Next, a variation of the band-pass filter 1 according to the present embodiment will be described. In the variation, the frequency of the attenuation pole formed by the first high-pass filter 11 and the frequency of the attenuation pole formed by the third high-pass filter 13 are substantially the same.

Figure 14:
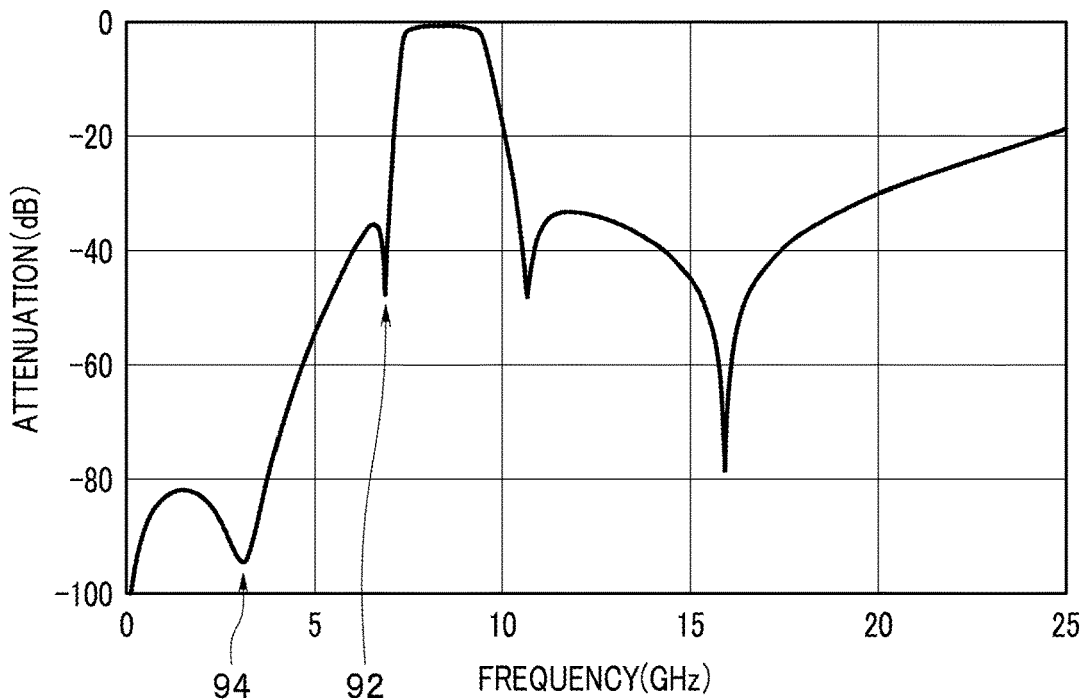
FIG. 14 is a characteristic chart showing pass attenuation characteristics of a model of a variation.

Here, pass attenuation characteristics of a model of the variation will be described. The model of the variation is a model of a variation of the band-pass filter 1 according to the present embodiment and is a model formed by combining structural models and circuit models as in the simulation described above. FIG. 14 shows pass attenuation characteristics of the model of the variation. In FIG. 14, the horizontal axis represents frequency, and the vertical axis represents attenuation. In FIG. 14, the reference numeral 92 denotes the attenuation pole formed by the second high-pass filter 12 (second attenuation pole 92), and the reference numeral 94 denotes one attenuation pole formed by the first and third high-pass filters 11 and 13. As shown in FIG. 14, in the variation, the pass attenuation on the low-pass side of the passband is sufficiently large.

The present invention is not limited to the foregoing embodiment, and various modifications may be made thereto. For example, as long as a requirement of the scope of claims is satisfied, the configuration of each of the high-pass filters and the low-pass filters as well as the number of high-pass filters and the number of low-pass filters in the present invention are arbitrary without being limited to the examples described in the embodiment.

Moreover, the fourth axis A4 may extend in a direction different from an extending direction of the second axis A2. In this case, the fourth axis A4 may be parallel to each of the first and third axes A1 and A3.

Obviously, many modifications and variations of the present invention are possible in the light of the above teachings. Thus, it is to be understood that, within the scope of the appended claims and equivalents thereof, the present invention may be practiced in other embodiments than the foregoing most preferable embodiment.

What is claimed is:

1. A band-pass filter that selectively passes a signal of a frequency in a predetermined passband, the band-pass filter comprising:
   a first port;
   a second port;
   a first high-pass filter, a second high-pass filter, and a third high-pass filter provided between the first port and the second port in this order from a first-port side in a circuit configuration;
   a first low-pass filter provided between the second high-pass filter and the third high-pass filter in the circuit configuration; and
   a stack including a plurality of dielectric layers stacked together, wherein
   each of the first to third high-pass filters forms an attenuation pole on a low-pass side of the passband,
   a frequency of the attenuation pole formed by the second high-pass filter is higher than a frequency of the attenuation pole formed by each of the first and third high-pass filters,
   the first port, the second port, the first high-pass filter, the second high-pass filter, the third high-pass filter, and the first low-pass filter are integrated into the stack,
   the first high-pass filter includes a first inductor wound around a first axis,
   the second high-pass filter includes a second inductor wound around a second axis, and
   the third high-pass filter includes a third inductor wound around a third axis.

2. A band-pass filter that selectively passes a signal of a frequency in a predetermined passband, the band-pass filter comprising:
   a first port;
   a second port;
   a first high-pass filter, a second high-pass filter, and a third high-pass filter provided between the first port and the second port in this order from a first-port side in a circuit configuration; and
   a first low-pass filter provided between the second high-pass filter and the third high-pass filter in the circuit configuration, wherein
   each of the first to third high-pass filters forms an attenuation pole on a low-pass side of the passband,
   a frequency of the attenuation pole formed by the second high-pass filter is higher than a frequency of the attenuation pole formed by each of the first and third high-pass filters, and
   wherein no low-pass filter is provided between the first high-pass filter and the second high-pass filter in the circuit configuration.

3. The band-pass filter according to claim 2, wherein the frequency of the attenuation pole formed by the first high-pass filter is different from the frequency of the attenuation pole formed by the third high-pass filter.

4. The band-pass filter according to claim 2, further comprising
   a stack including a plurality of dielectric layers stacked together, wherein
   the first port, the second port, the first high-pass filter, the second high-pass filter, the third high-pass filter, and the first low-pass filter are integrated into the stack.

5. The band-pass filter according to claim 4, wherein the third high-pass filter is not adjacent to the first high-pass filter in the stack.

6. The band-pass filter according to claim 4, wherein the second high-pass filter is arranged between the first high-pass filter and the third high-pass filter in the stack.

7. The band-pass filter according to claim 4, wherein the first low-pass filter is arranged between the first high-pass filter and the third high-pass filter in the stack.

8. The band-pass filter according to claim 4, wherein the first to third high-pass filters do not physically share ground in the stack.

9. The band-pass filter according to claim 8, further comprising
   a first ground terminal, a second ground terminal, and a third ground terminal arranged on an outer surface of the stack, wherein
   the first high-pass filter is electrically connected to the first ground terminal,
   the second high-pass filter is electrically connected to the second ground terminal, and
   the third high-pass filter is electrically connected to the third ground terminal.

10. The band-pass filter according to claim 8, wherein
    the first high-pass filter includes a first inductor,
    the second high-pass filter includes a second inductor,
    the third high-pass filter includes a third inductor, and
    the first to third inductors are not electrically connected to each other in the stack.

11. The band-pass filter according to claim 4, wherein
    the first high-pass filter includes a first inductor wound around a first axis,
    the second high-pass filter includes a second inductor wound around a second axis, and
    the third high-pass filter includes a third inductor wound around a third axis.

12. The band-pass filter according to claim 11, wherein the first axis and the second axis extend in directions different from each other.

13. The band-pass filter according to claim 11, wherein the second axis and the third axis extend in directions different from each other.

14. The band-pass filter according to claim 11, wherein each of the first axis, the second axis, and the third axis is orthogonal to a stacking direction of the plurality of dielectric layers.

15. The band-pass filter according to claim 11, wherein the first low-pass filter includes a fourth inductor wound around a fourth axis, and the fourth axis extends in a direction different from one or more directions of one or two of the first axis, the second axis, and the third axis.

16. A band-pass filter that selectively passes a signal of a frequency in a predetermined passband, the band-pass filter comprising:
   a first port;
   a second port;
   a first high-pass filter, a second high-pass filter, and a third high-pass filter provided between the first port and the second port in this order from a first-port side in a circuit configuration;
   a first low-pass filter provided between the second high-pass filter and the third high-pass filter in the circuit configuration; and
   a stack including a plurality of dielectric layers stacked together, wherein
   each of the first to third high-pass filters forms an attenuation pole on a low-pass side of the passband,
   a frequency of the attenuation pole formed by the second high-pass filter is higher than a frequency of the attenuation pole formed by each of the first and third high-pass filters,
   the first port, the second port, the first high-pass filter, the second high-pass filter, the third high-pass filter, and the first low-pass filter are integrated into the stack, and
   the third high-pass filter is not adjacent to the first high-pass filter in the stack.

* * * * *